US012812924B2

(12) United States Patent
Takaya

(10) Patent No.: US 12,812,924 B2
(45) Date of Patent: Nov. 24, 2026

(54) FIELD EFFECT TRANSISTOR

(71) Applicant: DENSO CORPORATION, Kariya-city (JP)

(72) Inventor: Hidefumi Takaya, Kariya-city (JP)

(73) Assignee: DENSO CORPORATION, Kariya-city (JP)

( * ) Notice: Subject to any disclaimer, the term of this patent is extended or adjusted under 35 U.S.C. 154(b) by 608 days.

(21) Appl. No.: 18/354,769

(22) Filed: Jul. 19, 2023

(65) Prior Publication Data

US 2023/0361171 A1 Nov. 9, 2023

Related U.S. Application Data

(63) Continuation of application No. PCT/JP2021/037475, filed on Oct. 8, 2021.

(30) Foreign Application Priority Data

Mar. 11, 2021 (JP) ................................ 2021-039306

(51) Int. Cl.
*H10D 62/10* (2025.01)
*H10D 12/01* (2025.01)
(Continued)

(52) U.S. Cl.
CPC ......... *H10D 62/111* (2025.01); *H10D 12/031* (2025.01); *H10D 30/668* (2025.01);
(Continued)

(58) Field of Classification Search
CPC .. H10D 30/63; H10D 84/016; H10D 84/0195; H10D 62/103-111;
(Continued)

(56) References Cited

U.S. PATENT DOCUMENTS 6,673,679 B1 * 1/2004 Miyasaka ............ H10D 62/111 257/E21.418
7,915,671 B2 * 3/2011 Shibata ................ H10D 62/051 257/341

(Continued)

FOREIGN PATENT DOCUMENTS

JP 2021-040042 A 3/2021
WO WO-2019044921 A1 * 3/2019 ........... H10D 62/054
WO WO-2019044922 A1 * 3/2019 ......... H10D 30/0297

OTHER PUBLICATIONS

El-Kareh, B., Hutter, L.N. (2020). High-Voltage and Power Transistors. In: Silicon Analog Components. Springer, Cham. https://doi.org/10.1007/978-3-030-15085-3_7 (Year: 2020).*

*Primary Examiner* — Julio J Maldonado
*Assistant Examiner* — Eric Manuel Mulero Flores
(74) *Attorney, Agent, or Firm* — Posz Law Group, PLC

(57) ABSTRACT

A field effect transistor includes a plurality of p-type deep layers and a plurality of n-type deep layers. Each of the p-type deep layers protrudes downward from a body layer, extends along a first direction that intersects the trench when a semiconductor substrate is viewed from above, and is disposed to have a spacing portion therebetween in a second direction that is orthogonal to the first direction when the semiconductor substrate is viewed from above. Each of the n-type deep layers is disposed in the spacing portion. A drift layer has a lower n-type impurity concentration than each of the n-type deep layers. A dimension of each of the n-type deep layers in a thickness direction of the semiconductor substrate is larger than a dimension of each of the n-type deep layers in the second direction.

19 Claims, 8 Drawing Sheets

(51) Int. Cl.
*H10D 30/66* (2025.01)
*H10D 62/17* (2025.01)
*H10D 62/832* (2025.01)
*H10P 30/20* (2026.01)

(52) U.S. Cl.
CPC ....... *H10D 62/393* (2025.01); *H10D 62/8325* (2025.01); *H10P 30/2042* (2026.01); *H10P 30/21* (2026.01)

(58) Field of Classification Search
CPC .......... H10D 62/051–054; H10D 62/126–127; H10D 62/393; H10D 62/109–111; H10D 62/105; H10D 30/60; H10D 30/66; H10D 30/668; H10D 62/10–111
See application file for complete search history.

(56) References Cited

U.S. PATENT DOCUMENTS

| | | | | |
|---|---|---|---|---|
| 7,943,989 | B2 | 5/2011 | Yilmaz et al. | |
| 9,515,137 | B2 | 12/2016 | Willmeroth et al. | |
| 11,107,911 | B2 * | 8/2021 | Takeuchi ............. | H10D 30/668 |
| 2002/0027237 | A1 * | 3/2002 | Onishi ................. | H10D 30/668<br>257/E29.027 |
| 2004/0238882 | A1 * | 12/2004 | Suzuki ................. | H10D 30/665<br>257/329 |
| 2005/0006717 | A1 * | 1/2005 | Yamaguchi .......... | H10D 62/393<br>257/E29.066 |
| 2006/0138407 | A1 * | 6/2006 | Yamaguchi .......... | H10D 30/668<br>257/E29.066 |
| 2007/0158740 | A1 | 7/2007 | Yoshikawa et al. | |
| 2007/0228490 | A1 * | 10/2007 | Kocon ................. | H10D 62/111<br>257/E29.012 |
| 2009/0200559 | A1 | 8/2009 | Suzuki et al. | |
| 2009/0206398 | A1 | 8/2009 | Yoshikawa et al. | |
| 2012/0319136 | A1 * | 12/2012 | Noborio ............... | H10D 12/038<br>257/77 |
| 2013/0082323 | A1 * | 4/2013 | Xiao .................. | H10D 30/0297<br>257/329 |
| 2020/0168732 | A1 | 5/2020 | Mitani et al. | |
| 2020/0235239 | A1 | 7/2020 | Noborio et al. | |

* cited by examiner

FIELD EFFECT TRANSISTOR

CROSS REFERENCE TO RELATED APPLICATIONS

The present application is a continuation application of International Patent Application No. PCT/JP2021/037475 filed on Oct. 8, 2021, which designated the U.S. and claims the benefit of priority from Japanese Patent Application No. 2021-039306 filed on Mar. 11, 2021. The entire disclosures of all of the above applications are incorporated herein by reference.

TECHNICAL FIELD

The present disclosure relates to a field effect transistor.

BACKGROUND

There has been known a field effect transistor that includes a plurality of p-type deep layers protruding downward from a body layer.

SUMMARY

The present disclosure provides a field effect transistor including a plurality of p-type deep layers and a plurality of n-type deep layers. Each of the p-type deep layers protrudes downward from a body layer, extends along a first direction that intersects the trench when a semiconductor substrate is viewed from above, and is disposed to have a spacing portion therebetween in a second direction that is orthogonal to the first direction when the semiconductor substrate is viewed from above. Each of the n-type deep layers is disposed in the spacing portion. A drift layer has a lower n-type impurity concentration than each of the n-type deep layers. A dimension of each of the n-type deep layers in a thickness direction of the semiconductor substrate is larger than a dimension of each of the n-type deep layers in the second direction.

BRIEF DESCRIPTION OF DRAWINGS

Objects, features and advantages of the present disclosure will become apparent from the following detailed description made with reference to the accompanying drawings. In the drawings:

FIG. 9 is a diagram showing the distribution of depletion layers in the n-type deep layer when the MOSFET is turned on;

DETAILED DESCRIPTION

Figure 1:
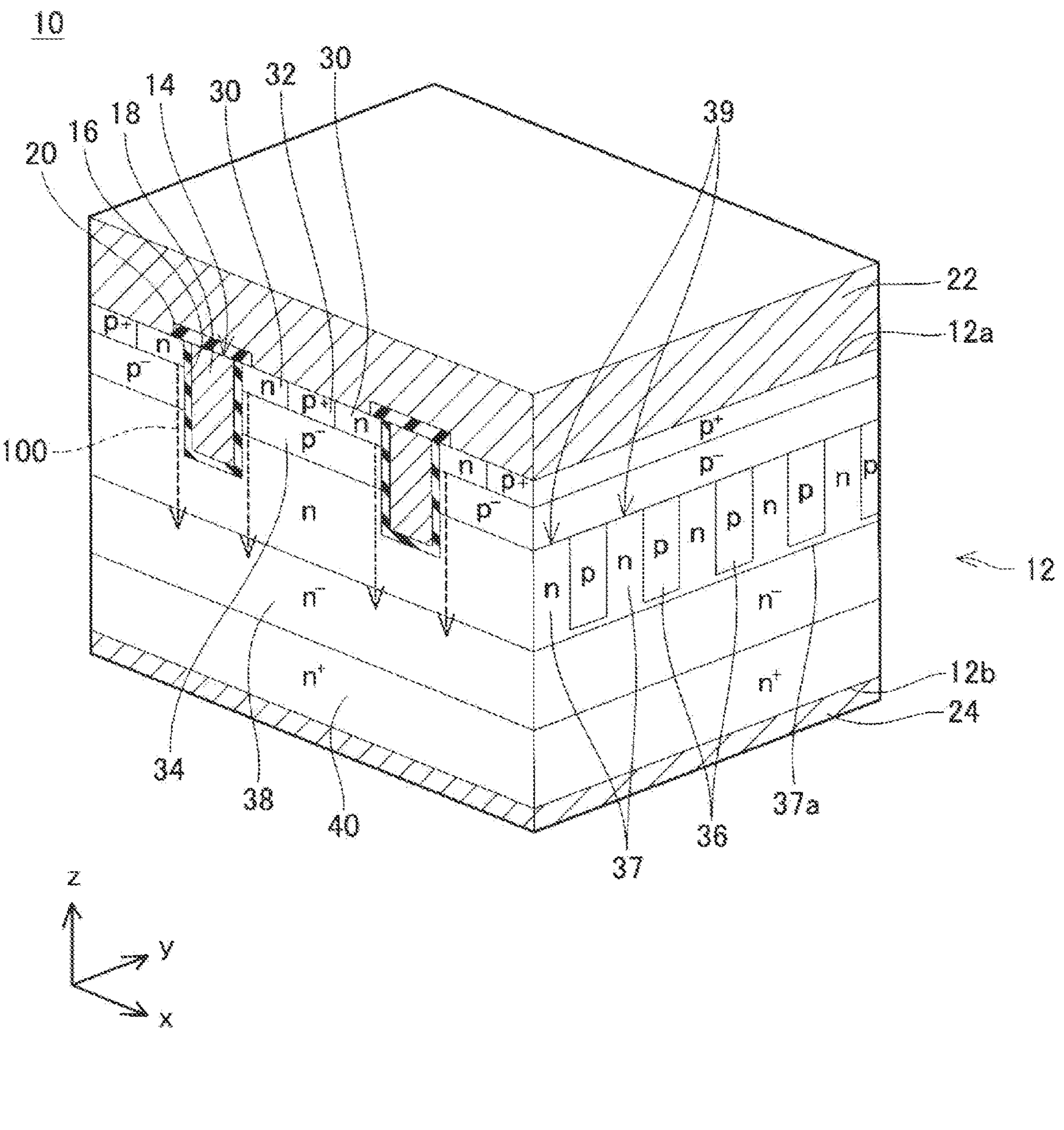
FIG. 1 is a cross-sectional perspective view of a metal-oxide-semiconductor field effect transistor (MOSFET) in an xz cross section not including p-type deep layers 36)

Next, a relevant technology is described only for understanding the following embodiments. A field effect transistor according to the relevant technology includes a plurality of p-type deep layers protruding downward from a body layer. Each of the p-type deep layers extends so as to intersect trenches when a semiconductor substrate is viewed from above. The p-type deep layers are arranged at intervals in a width direction of the p-type deep layers. Each of the p-type deep layers extends from the body layer to a position below a bottom surface of each of the trenches. Each of the p-type deep layers is in contact with a gate insulating film on a side surface of each of the trenches and the bottom surface of each of the trenches located below the body layer. The field effect transistor includes an n-type drift layer in contact with the body layer and each of the p-type deep layers. When the field effect transistor is turned off, a depletion layer spreads from the body layer into the drift layer. The source-drain voltage is held by the depletion layer extending into the drift layer. When the field effect transistor is turned off, a depletion layer also spreads from each of the p-type deep layers into the drift layer. Since each of the p-type deep layers is in contact with the gate insulating film on the bottom surface of each of the trenches, the drift layer in the vicinity of the bottom surface of each of the trenches is depleted by the depletion layer spreading from each of the p-type deep layers. In this manner, the depletion layer extending from each of the p-type deep layers to the vicinity of the bottom surface of each of the trenches restricts the occurrence of electric field concentration in the gate insulating film and the drift layer in the vicinity of the bottom surface of each of the trenches. Therefore, the above-described field effect transistor can have a high breakdown voltage.

When the above-described field effect transistor is turned on, a channel is formed in the body layer. Then, electrons flow from the source layer to the channel. Since there are the p-type deep layers on the lower side of the body layer, electrons that have passed through the channel flow into the drift layer disposed in the space between the p-type deep layers. The electrons that have passed through the spacing portion flow to the drift layer below the spacing portion. In this manner, electrons flow from the source layer to the drift layer below the spacing portion through the channel and the drift layer in the spacing portion. The drift layer in the spacing portion is sandwiched by the p-type deep layers. When the field effect transistor is in an on-state, a depletion layer spreads from each of the p-type deep layers to the drift layer in the spacing portion. The depletion layer spreading in this manner narrows a path through which electrons flow in the drift layer located in the spacing portion. As a result, the resistance of the spacing portion increases. Therefore, the above-described field effect transistor has a high on-resistance.

A field effect transistor according to an aspect of the present disclosure includes a semiconductor substrate having a trench on an upper surface, a gate insulating film covering an inner surface of the trench, and a gate electrode disposed in the trench and being insulated from the semiconductor substrate by the gate insulating film. The semiconductor substrate includes a source layer of n-type being in contact with the gate insulating film on a side surface of the trench, a body layer of p-type located below the source layer and being in contact with the gate insulating film on the side surface of the trench, a plurality of p-type deep layers, a plurality of n-type deep layers, and a drift layer. Each of the plurality of p-type deep layers protrudes downward from the body layer, extends from the body layer to a position below a bottom surface of the trench, extends along a first direction that intersects the trench when the semiconductor substrate is viewed from above, is disposed to have a spacing portion therebetween in a second direction that is orthogonal to the first direction when the semiconductor substrate is viewed from above, and is in contact with the gate insulating film on the side surface of the trench and the bottom surface of the trench located below the body layer. Each of the plurality of n-type deep layers is disposed in the spacing portion and is in contact with the gate insulating film on the side surface of the trench located below the body layer. The drift layer is n-type having an n-type impurity concentration lower than an n-type impurity concentration of each of the plurality of n-type deep layers, and is in contact with a lower surface of each of the plurality of n-type deep layers. Each of the plurality of p-type deep layers has a shape in which a dimension in a thickness direction of the semiconductor substrate is larger than a dimension in the second direction. Each of the plurality of n-type deep layers has a shape in which a dimension in the thickness direction of the semiconductor substrate is larger than a dimension in the second direction.

The "dimension in the second direction" of each of the p-type deep layers means a distance between both side surfaces of each of the p-type deep layers in the second direction. The "dimension in the thickness direction of the semiconductor substrate" of each of the p-type deep layers means a distance in the thickness direction of the semiconductor substrate from a lower surface of the body layer (that is, an upper surface of each of the p-type deep layers) to a lower surface of each of the p-type deep layers. The "dimension in the second direction" of each of the n-type deep layer means a distance between both side surfaces of each of the n-type deep layers in the second direction. The "dimension in the thickness direction of the semiconductor substrate" of each of the n-type deep layers means a distance in the thickness direction of the semiconductor substrate from the lower surface of the body layer (that is, an upper surface of each of the n-type deep layers) to the lower surface of each of the n-type deep layers.

Since the field effect transistor has the p-type deep layers, it is possible to restrict an electric field concentration in the vicinity of the bottom surface of the trench when the field effect transistor is turned off. Therefore, the above-described field effect transistor can have a high breakdown voltage. In the field effect transistor, each of the n-type deep layers having a higher n-type impurity concentration than the drift layer is disposed in the spacing portion between the p-type deep layers. The dimension of each of the n-type deep layers in the thickness direction of the semiconductor substrate is larger than the dimension of each of the n-type deep layers in the second direction. That is, each of the n-type deep layer has a shape elongated in a vertical direction (that is, in the thickness direction of the semiconductor substrate). Therefore, a wide range of the spacing portion is constituted by each of the n-type deep layers. When the field effect transistor is turned on, electrons flow from the source layer to the drift layer through the channel and the n-type deep layers. Since each of the n-type deep layers is disposed in the spacing portion, depletion layers spread from the p-type deep layers on both sides of each of the n-type deep layers. However, since the n-type impurity concentration of each of the n-type deep layers is high, the width of the depletion layer extending from each of the p-type deep layers to each of the n-type deep layers is narrow. Therefore, a wide electron flow path is secured in the n-type deep layers. Therefore, the resistance of the spacing portion can be reduced. Therefore, according to the configuration of this field effect transistor, a low on-resistance can be realized.

In one example, in the field effect transistor, the plurality of n-type deep layers may extend from a lower surface of the body layer to a depth of a lower surface of each of the plurality of p-type deep layers. In this case, the plurality of n-type deep layers may extend from the lower surface of the body layer to a position below the lower surface of each of the plurality of p-type deep layers.

According to these configurations, it is possible to configure the entire spacing portion with the n-type deep layers having the high n-type impurity concentration. Therefore, the on-resistance of the field effect transistor can be further reduced.

In one example, in the field effect transistor, the plurality of n-type deep layers may be connected to each other via a region below the lower surface of each of the plurality of p-type deep layers.

In one example, in the field effect transistor, the dimension of the plurality of n-type deep layers in a thickness direction of the semiconductor substrate may be 1.07 times or less the dimension of the plurality of p-type deep layers in the thickness direction of the semiconductor substrate.

According to this configuration, a higher breakdown voltage can be realized in the field effect transistor.

Figure 2:
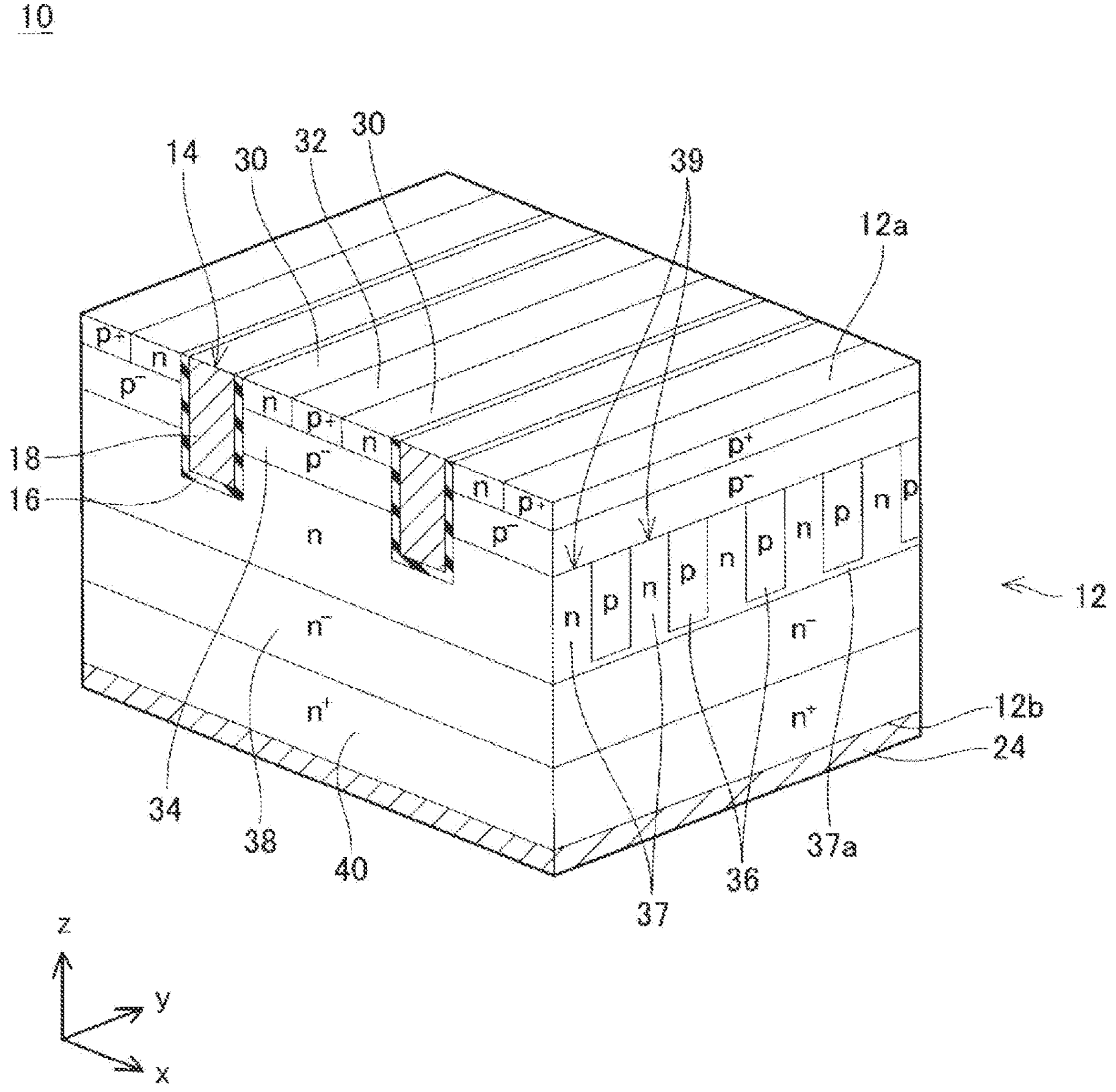
FIG. 2 is a cross-sectional perspective view of the MOSFET in which a source electrode 22 and an interlayer insulating film are omitted.

A metal-oxide-semiconductor field effect transistor (MOSFET) 10 of an embodiment shown in FIG. 1 and FIG. 2 includes a semiconductor substrate 12. In the following, a direction parallel to an upper surface 12*a* of the semiconductor substrate 12 may also be referred to as an x-direction, a thickness direction of the semiconductor substrate 12 may also be referred to as a z-direction, and a direction perpendicular to the x-direction and the z-direction may also be referred to as a y-direction. The semiconductor substrate 12 is made of silicon carbide (SiC). However, the semiconductor substrate 12 may also be made of other material such as silicon or gallium nitride. A plurality of trenches 14 are provided from the upper surface 12*a* of the semiconductor substrate 12. As shown in FIG. 2, the trenches 14 extend in the y-direction on the upper surface 12*a*. The trenches 14 are arranged at intervals in the x-direction.

As shown in FIG. 1 and FIG. 2, an inner surface (that is, a bottom surface and a side surface) of each of the trenches 14 is covered with a gate insulation film 16. A gate electrode 18 is disposed in each of the trenches 14. The gate electrode 18 is insulated from the semiconductor substrate 12 by the gate insulation film 16. As shown in FIG. 1, an upper surface of the gate electrode 18 is covered with an interlayer insulation film 20. A source electrode 22 is disposed on the semiconductor substrate 12. The source electrode 22 covers each of the interlayer insulation films 20. The source electrode 22 is insulated from the gate electrodes 18 by the interlayer insulation films 20. The source electrode 22 is in contact with the upper surface 12*a* of the semiconductor substrate 12 at portions where the interlayer insulation films 20 are not provided. A drain electrode 24 is disposed at a bottom of the semiconductor substrate 12. The drain electrode 24 is in contact with the entire region of a lower surface 12*b* of the semiconductor substrate 12.

As shown in FIG. 1 and FIG. 2, the semiconductor substrate 12 includes a plurality of source layers 30, a plurality of contact layers 32, a body layer 34, a plurality of p-type deep layers 36, a plurality of n-type deep layers 37, a drift layer 38, and a drain layer 40.

Each of the source layers 30 is an n-type layer having a high n-type impurity concentration. Each of the source layers 30 is disposed in a range partially including the upper surface 12*a* of the semiconductor substrate 12. Each of the source layers 30 is in ohmic contact with the source electrode 22. Each of the source layers 30 is in contact with the gate insulating film 16 at an uppermost portion of the side surface of the trench 14. Each of the source layers 30 faces the gate electrode 18 with the gate insulating film 16 interposed therebetween. Each of the source layers 30 extends in the y direction along the side surface of the trench 14.

Each of the contact layers 32 is a p-type layer having a high p-type impurity concentration. Each of the contact layers 32 is disposed in a range partially including the upper surface 12*a* of the semiconductor substrate 12. Each of the contact layers 32 is disposed between two corresponding source layers 30. Each of the contact layers 32 is in ohmic contact with the source electrode 22. Each of the contact layers 32 extends in the y direction.

The body layer 34 is a p-type layer having a lower p-type impurity concentration than the contact layers 32. The body layer 34 is disposed below the source layers 30 and the contact layers 32. The body layer 34 is in contact with the source layers 30 and the contact layers 32 from below. The body layer 34 is in contact with the gate insulating film 16 on the side surface of the trench 14 located below the source layer 30. The body layer 34 faces the gate electrode 18 with the gate insulating film 16 interposed therebetween.

Figure 3:
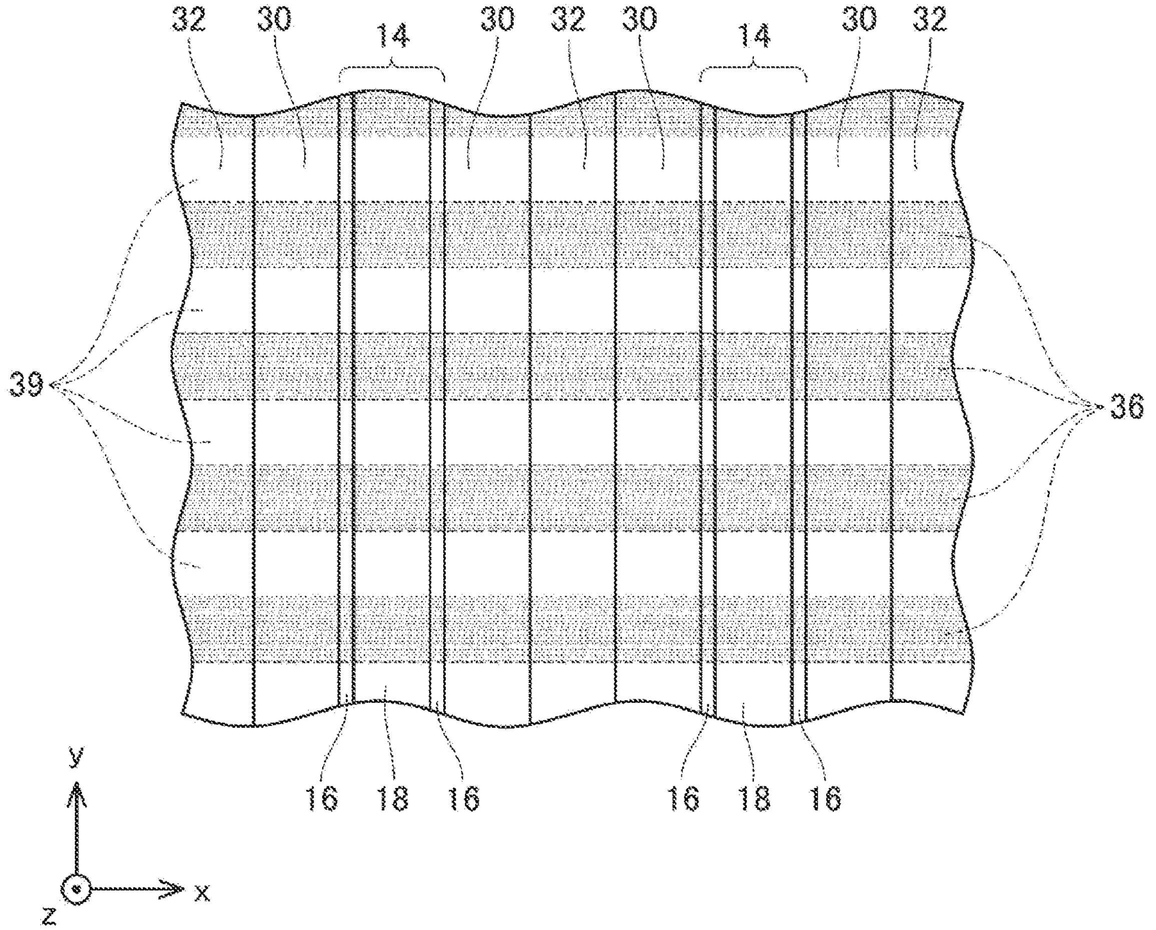
FIG. 3 is a plan view showing the arrangement of trenches and the p-type deep layers when a semiconductor substrate is viewed from above.
Figure 4:
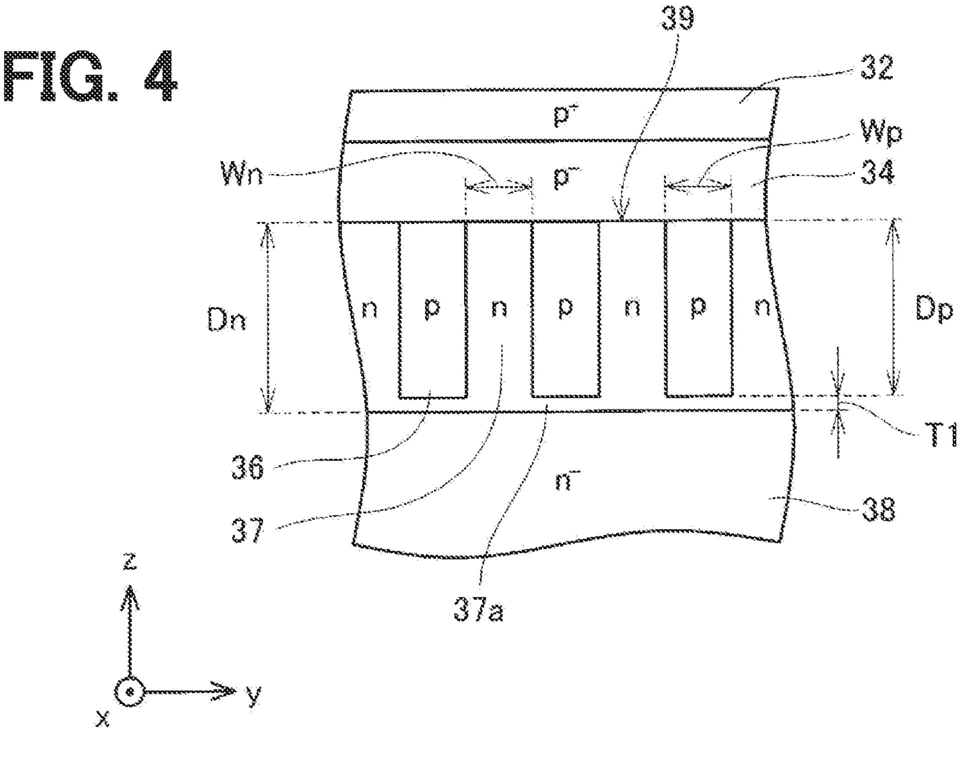
FIG. 4 is an enlarged sectional view of the p-type deep layers and n-type deep layers.
Figure 5:
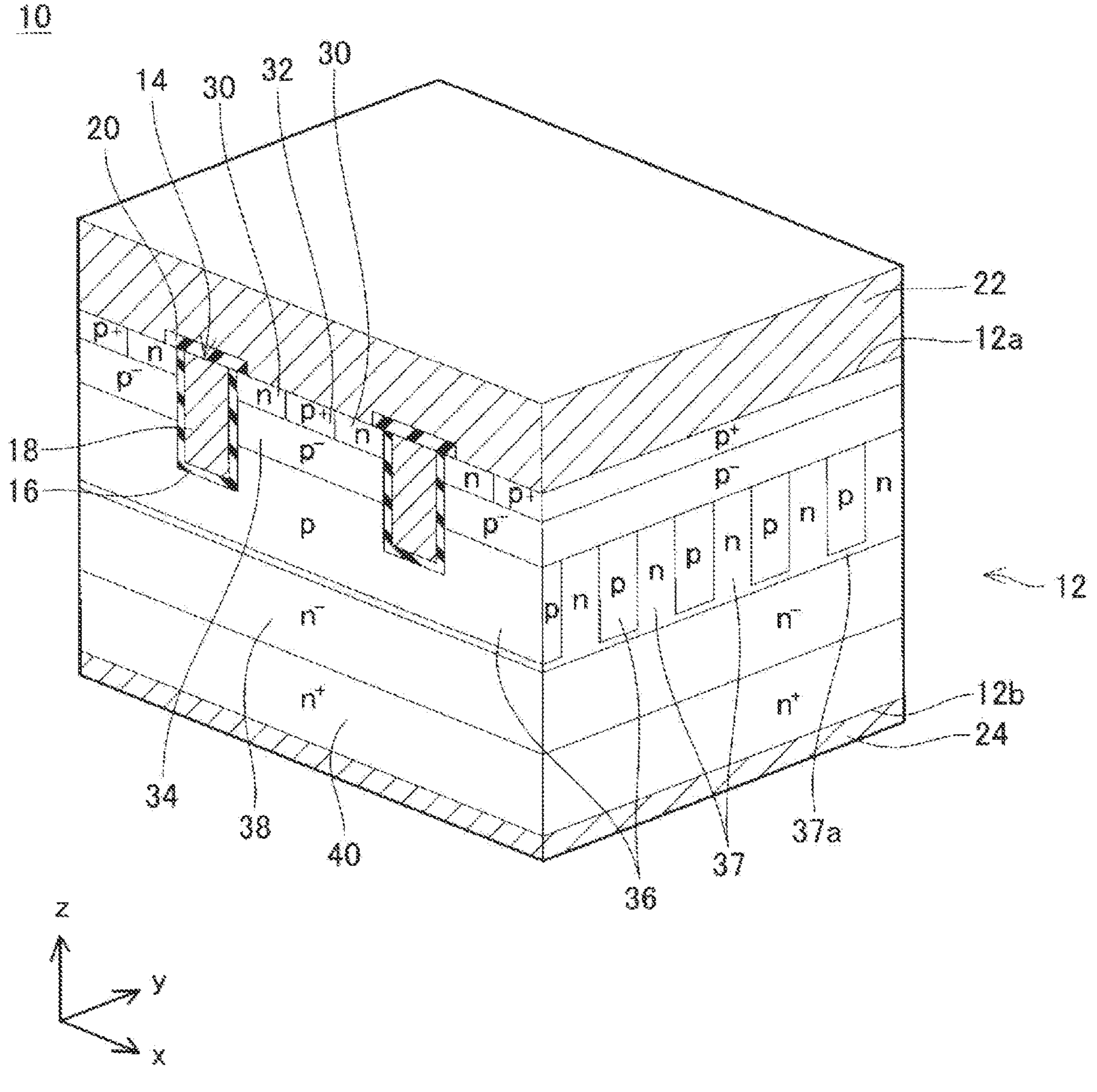
FIG. 5 is a cross-sectional perspective view of the MOSFET in an xz cross section including the p-type deep layers.

Each of the p-type deep layers 36 is a p-type layer protruding downward from the lower surface of the body layer 34. A p-type impurity concentration of each of the p-type deep layers 36 is higher than the p-type impurity concentration of the body layer 34 and lower than the p-type impurity concentration of the contact layer 32. As shown in FIG. 3, when the semiconductor substrate 12 is viewed from above, each of the p-type deep layers 36 extends in the x-direction and is orthogonal to the trenches 14. The p-type deep layers 36 are arranged at intervals in the y-direction. Hereinafter, a portion between the p-type deep layers 36 is referred to as a spacing portion 39. As shown in FIG. 4, the p-type deep layers 36 have a shape elongated in the z-direction in the yz cross section. That is, a dimension of the p-type deep layers 36 in the z-direction (hereinafter, referred to as a depth Dp) is larger than a dimension of the p-type deep layers 36 in the y direction (hereinafter, referred to as a width Wp). For example, the depth Dp can be set to 1 to 4 times the width Wp. As shown in FIG. 5, each of the p-type deep layers 36 extends from the lower surface of the body layer 34 to a depth below the bottom surface of each of the trenches 14. Each of the p-type deep layers 36 is in contact with the gate insulating film 16 on the side surface of each of the trenches 14 located below the body layer 34. In addition, each of the p-type deep layers 36 is in contact with the gate insulating film 16 on the bottom surface of each of the trenches 14. Each of the p-type deep layers 36 faces the gate electrode 18 with the gate insulating film 16 interposed therebetween.

Each of the n-type deep layers 37 is an n-type layer having an n-type impurity concentration higher than that of the drift layer 38. The n-type impurity concentration of each of the n-type deep layers 37 is lower than the p-type impurity concentration of each of the p-type deep layers 36. As shown in FIG. 1 and FIG. 2, each of the n-type deep layers 37 is disposed in a corresponding spacing portion 39. Each of the n-type deep layers 37 is in contact with the lower surface of the body layer 34. Each of the n-type deep layers 37 is in contact with the side surfaces of the p-type deep layer 36 on both sides thereof. Each of the n-type deep layers 37 extends from the lower surface of the body layer 34 to a depth below the bottom surface of each of the trenches 14 and the lower surface of each of the p-type deep layers 36. As shown in FIG. 4, each of the n-type deep layers 37 in the spacing portion 39 has a shape elongated in the z-direction in the yz cross section. That is, a dimension of each of the n-type deep layers 37 in the z direction (hereinafter, referred to as a depth Dn) is larger than a dimension of each of the n-type deep layers 37 in the spacing portion 39 in the y-direction (hereinafter, referred to as a width Wn). For example, the depth Dn can be set to 1 to 4 times the width Wn. In the present embodiment, the width Wn of each of the n-type deep layers 37 is substantially equal to the width Wp of each of the p-type deep layers 36. Each of the n-type deep layers 37 has a connection region 37*a* extending directly below the lower surface of the adjacent p-type deep layer 36. Each of the connection regions 37*a* is in contact with the lower surface of the corresponding one of the p-type deep layers 36. The n-type deep layers 37 are connected to each other via the connection regions 37*a*. A thickness T1 of portions where the n-type deep layers 37 protrude below the lower surfaces of the p-type deep layers 36 (that is, a distance in the z-direction from the lower surfaces of the p-type deep layers 36 to the lower surfaces of the n-type deep layers 37) is about 0.1 μm, which is extremely thin. As shown in FIG. 1 and FIG. 2, each of the n-type deep layers 37 is in contact with the gate insulating film 16 in each of the spacing portions 39. That is, each of the n-type deep layers 37 is in contact with the gate insulating film 16 on the side surface of each of the trenches 14 and the bottom surface of each of the trenches 14 located below the body layer 34.

The drift layer 38 is an n-type layer having an n-type impurity concentration lower than that of the source layers 30. The drift layer 38 is disposed below the n-type deep layers 37. The drift layer 38 is in contact with the n-type deep layers 37 from below.

The drain layer 40 is an n-type layer having a higher n-type impurity concentration than the drift layer 38 and the n-type deep layers 37. The drain layer 40 is in contact with the drift layer 38 from below. The drain layer 40 is arranged in a region including the lower surface 12*b* of the semiconductor substrate 12. The drain layer 40 is in ohmic contact with the drain electrode 24.

Figure 6:
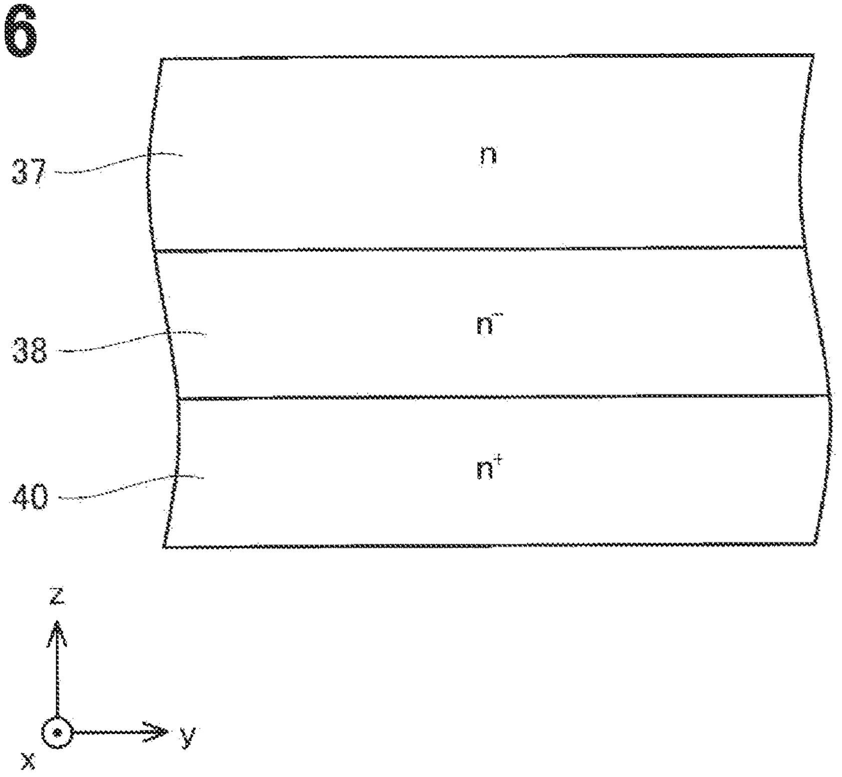
FIG. 6 is an explanatory diagram of a manufacturing method of the MOSFET 10.
Figure 7:
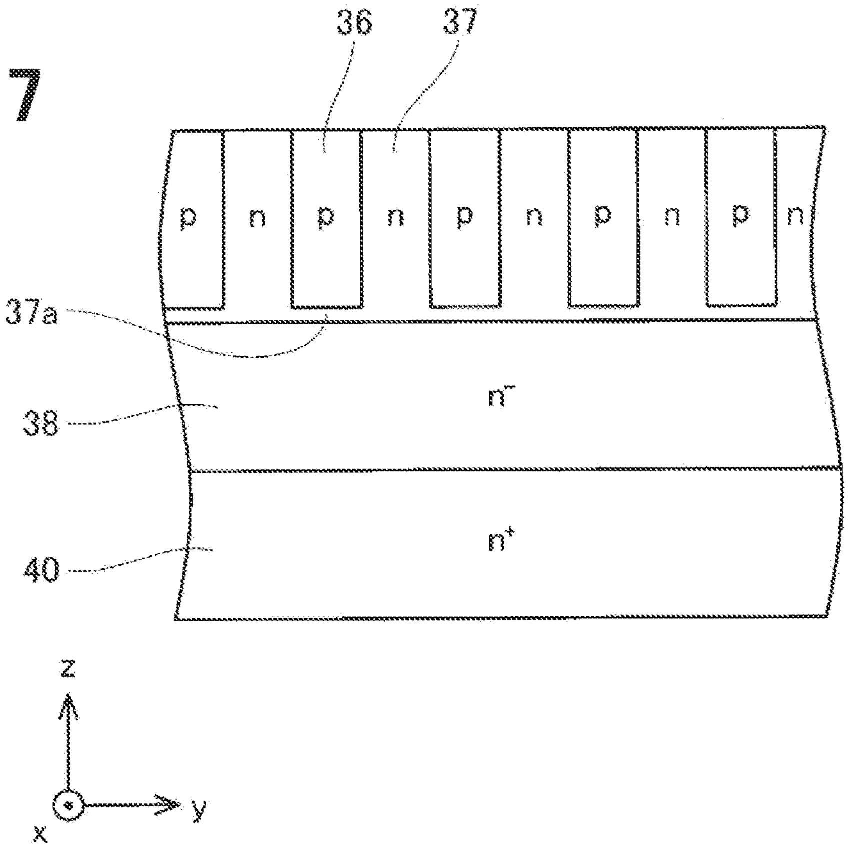
FIG. 7 is an explanatory diagram of a manufacturing method of the MOSFET 10.
Figure 8:
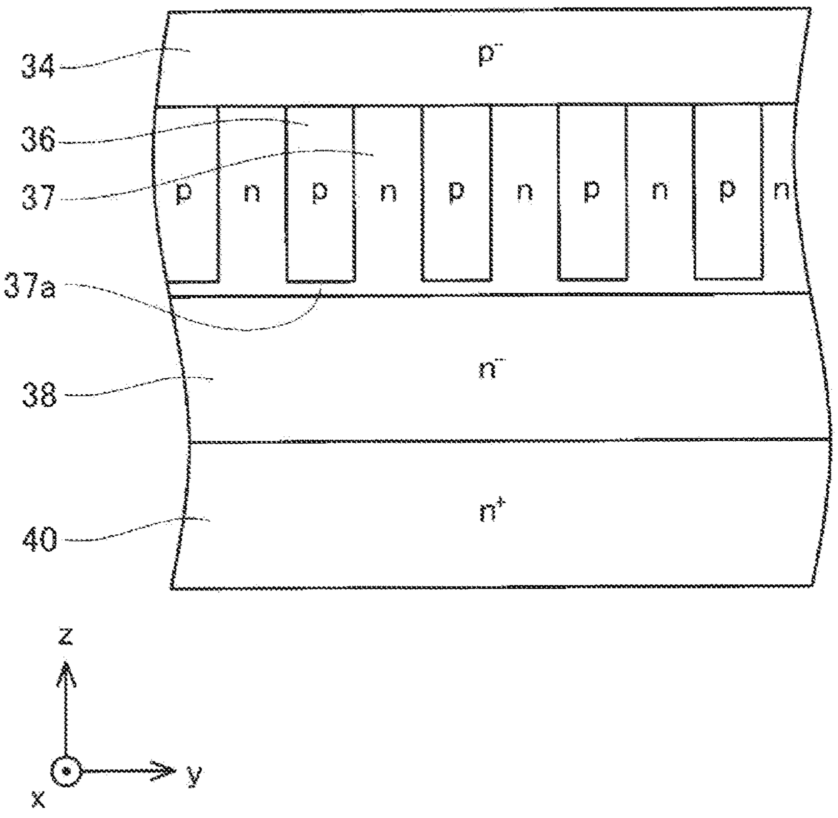
FIG. 8 is an explanatory diagram of a manufacturing method of the MOSFET 10.

Next, a manufacturing method of the MOSFET 10 will be described. The MOSFET 10 is manufactured from a semiconductor substrate entirely constituted by the drain layer 40. First, as shown in FIG. 6, the drift layer 38 is formed on the drain layer 40 by epitaxial growth, and the n-type deep layer 37 is formed by ion implantation of an n-type impurity into a surface layer portion of the drift layer 38. Next, as shown in FIG. 7, the p-type deep layers 36 are formed in the n-type deep layer 37 by selectively implanting ions of a p-type impurity into the n-type deep layer 37. Next, as shown in FIG. 8, the body layer 34 is formed on the n-type deep layers 37 and the p-type deep layers 36 by epitaxial growth. The forming of the p-type deep layers 36 may be performed after the forming of the body layer 34. Next, the source layer 30 and the contact layer 32 are formed by selectively implanting ions of an n-type impurity and a p-type impurity into the body layer 34. Thereafter, the trenches 14, the gate insulating films 16, the gate electrodes 18, the interlayer insulating films 20, the source electrode 22, and the drain electrode 24 are formed. Accordingly, the MOSFET 10 is completed.

When the MOSFET 10 is used, a higher potential is applied to the drain electrode 24 as compared to the source electrode 22. When a potential equal to or higher than a gate threshold value is applied to each of the gate electrodes 18, a channel is formed in the body layer 34 in the vicinity of the gate insulating film 16. The source layers 30 and the n-type deep layers 37 are connected by the channel. Therefore, as indicated by arrows 100 in FIG. 1, electrons flow from the source layer 30 to the drain layer 40 through the channel, the n-type deep layers 37, and the drift layer 38. That is, the MOSFET 10 is turned on. When the potential of each of the gate electrodes 18 is reduced from a value equal to or higher than the gate threshold value to a value less than the gate threshold value, the channel disappears and the flow of electrons stops. In other words, the MOSFET 10 is turned off.

Next, the operation when the MOSFET 10 is turned off will be described in more detail. When the channel disappears, a reverse voltage is applied to a pn junction at an interface between the body layer 34 and each of the n-type deep layers 37. Therefore, a depletion layer spreads from the body layer 34 to each of the n-type deep layers 37. Each of the p-type deep layers 36 is connected to the body layer 34 and has substantially the same potential as the body layer 34. Therefore, when the channel disappears, a reverse voltage is also applied to a pn junction at an interface between each of the p-type deep layers 36 and each of the n-type deep layers 37. Therefore, a depletion layer also spreads from each of the p-type deep layers 36 to each of the n-type deep layers 37. As shown in FIG. 5, at an intersection of each of the p-type deep layers 36 and each pf the trenches 14, each of the p-type deep layers 36 is present immediately below each of the trenches 14. Therefore, the depletion layer spreads from each of the p-type deep layers 36 immediately below each of the trenches 14 to each of the n-type deep layers 37 in the vicinity of the bottom surface of each the trenches 14. In this way, each of the n-type deep layers 37 in the vicinity of the bottom surface of each of the trenches 14 is quickly depleted by the depletion layer spreading from each of the p-type deep layers 36. Accordingly, the electric field concentration in the vicinities of the bottom surfaces of the trenches 14 can be restricted. In addition, the entire portion of each of the n-type deep layers 37 is depleted by the depletion layers extending from the body layer 34 and each of the p-type deep layers 36. Note that since each of the n-type deep layers 37 has the n-type impurity concentration lower than that of the drift layer 38, a depletion layer is less likely to spread in each of the n-type deep layers 37 than in the drift layer 38. However, since each of the n-type deep layers 37 is sandwiched by the p-type deep layers 36 and the width Wn of each of the n-type deep layers 37 is narrow, the entire portion of each of the n-type deep layers 37 is depleted. The depletion layer spreads to the drift layer 38 through each of the n-type deep layers 37. Since the n-type impurity concentration of the drift layer 38 is low, almost the entire portion of the drift layer 38 is depleted. The high voltage applied between the drain electrode 24 and the source electrode 22 is held by the depleted drift layer 38 and each of the n-type deep layers 37. Therefore, the MOSFET 10 has a high breakdown voltage.

Figure 9:
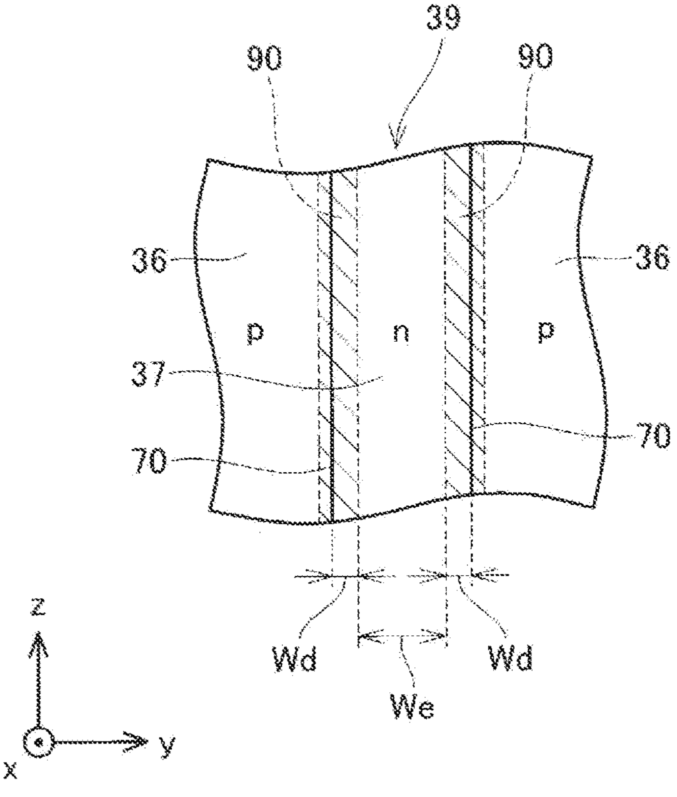

Next, the operation when the MOSFET 10 is turned on will be described in more detail. As described above, when the MOSFET 10 is turned on, electrons flow from the source layers 30 to the drift layer 38 through the channel and the n-type deep layers 37 as indicated by the arrows 100 in FIG. 1. FIG. 9 shows s distribution of depletion layers in each of the n-type deep layers 37 when the MOSFET 10 is on. In FIG. 9, hatched regions are depletion layers 90. In a state where the MOSFET 10 is turned on, no reverse voltage is applied to the pn junction at the interface between each of the n-type deep layer 37 and the adjacent p-type deep layer 36 (hereinafter, referred to as a pn junction 70). However, even in this state, the depletion layer 90 is present in the pn junction 70 due to a built-in potential. In the present embodiment, since the n-type impurity concentration of each of the n-type deep layers 37 is high, a width Wd of the depletion layer 90 extending from the pn junction 70 into each of the n-type deep layers 37 is narrow. For this reason, a width We of the electron flow path (that is, a portion where each of the n-type deep layers 37 is not depleted) in each of the spacing portions 39 is wide. Therefore, when the MOSFET 10 is turned on, the resistance of each of the n-type deep layers 37 is low. Therefore, the MOSFET 10 has a low on-resistance.

Figure 10:
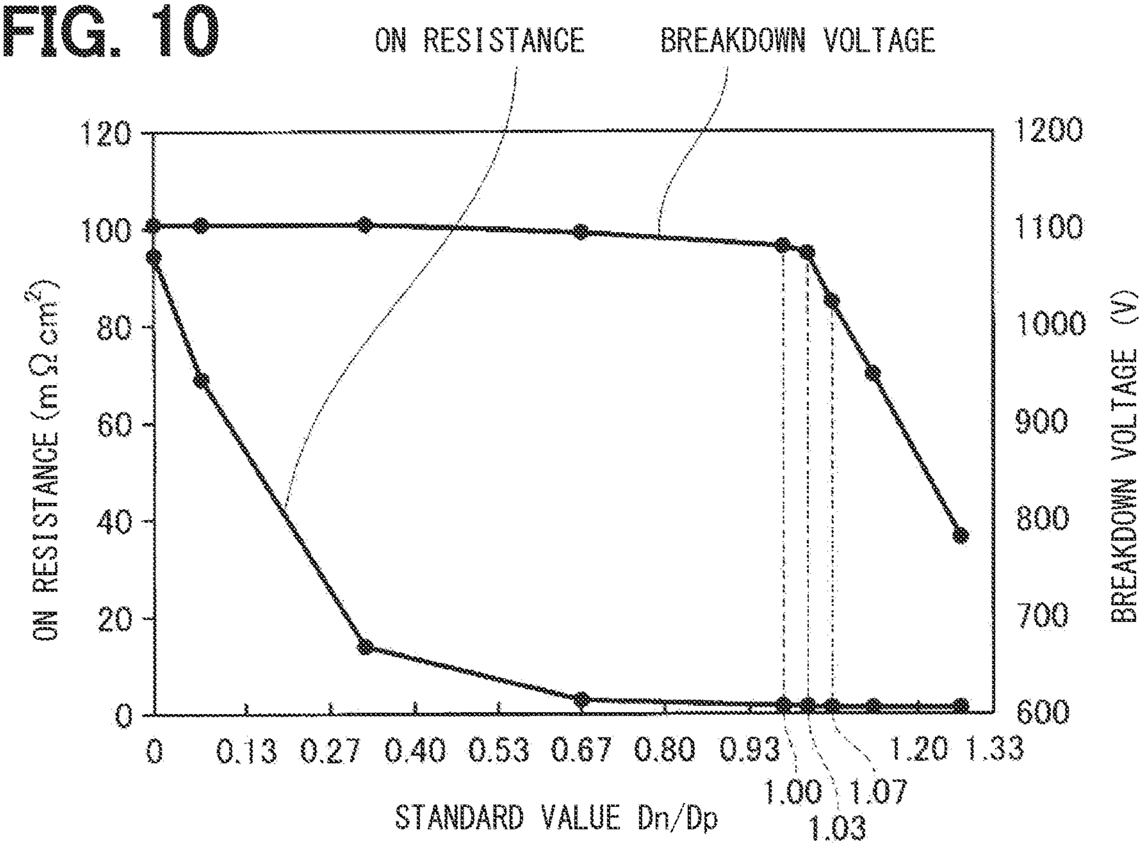
FIG. 10 is a graph showing the relationship between the standard value Dn/Dp and the characteristics of the MOSFET.
Figure 11:
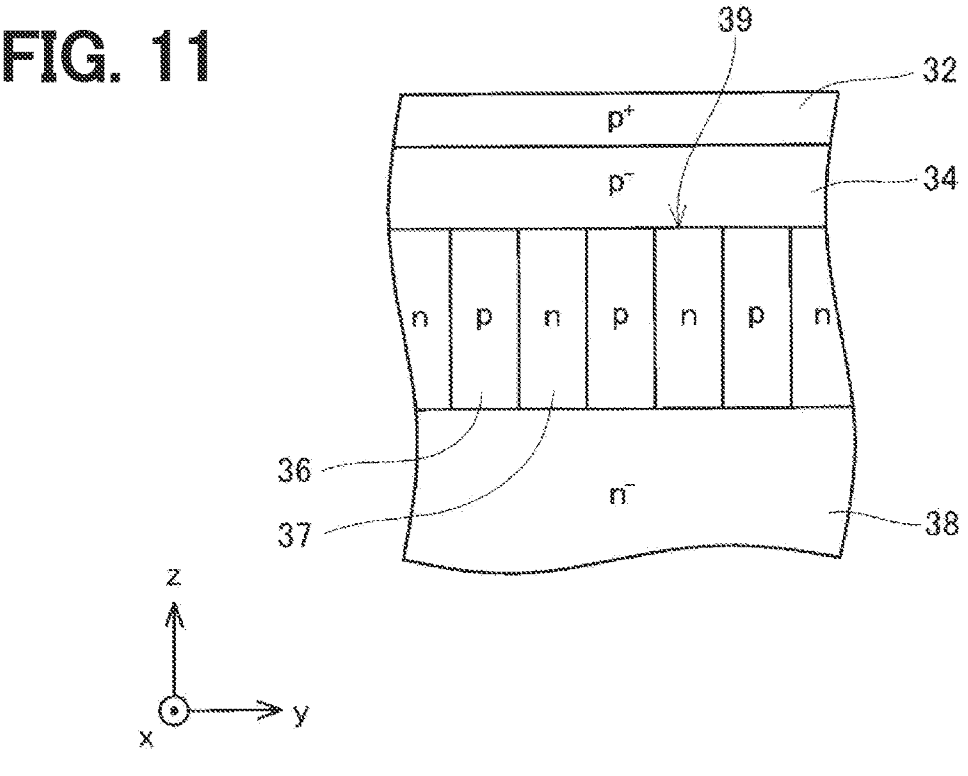
FIG. 11 is an enlarged sectional view of p-type deep layers and n-type deep layers of a MOSFET according to a first modification.
Figure 12:
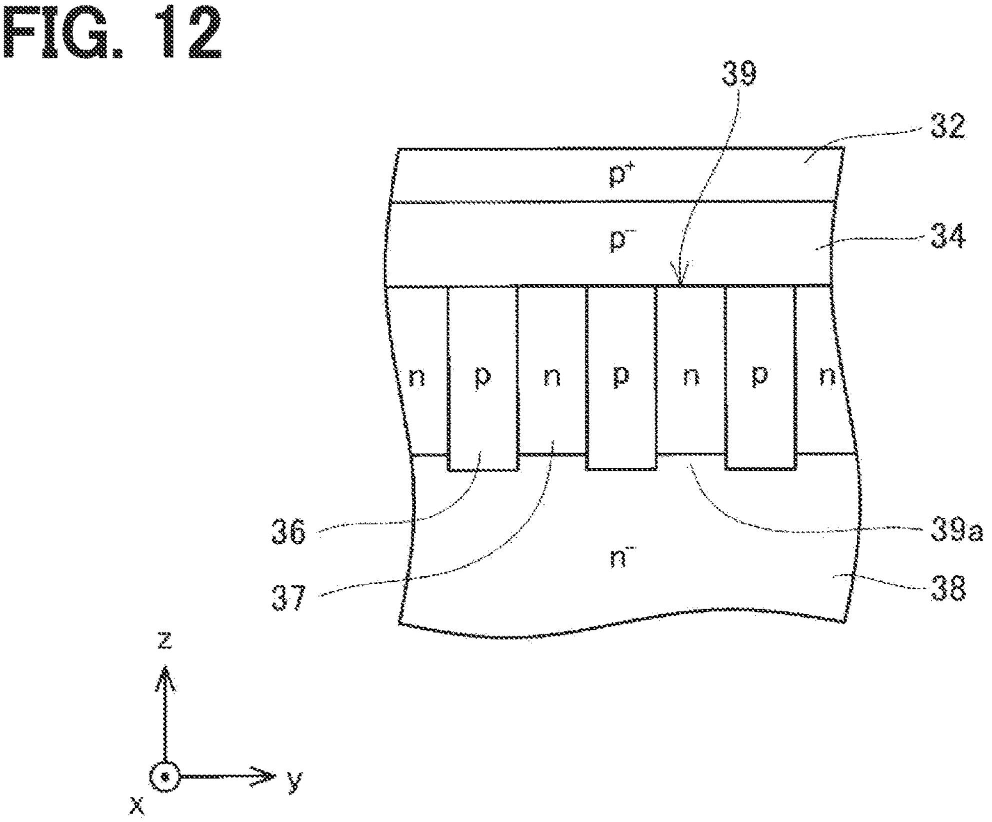
FIG. 12 is an enlarged sectional view of p-type deep layers and n-type deep layers of a MOSFET according to a second modification.

As described above, according to the structure of the MOSFET 10 of the present embodiment, it is possible to realize a high breakdown voltage and a low on-resistance. FIG. 10 shows a simulation result of the on-resistance and the breakdown voltage of the MOSFET when the depth Dn of each of the n-type deep layers 37 is changed. The horizontal axis represents the standard value Dn/Dp obtained by dividing the depth Dn of each of the n-type deep layers 37 by the depth Dp of each of the p-type deep layers 36. In the case of Dn/Dp>1.00, as shown in FIG. 4, each of the n-type deep layers 37 extends to a position below the p-type deep layer 36. In the case of Dn/Dp=1.00, as shown in FIG. 11, the lower end of each of the n-type deep layers 37 and the lower end of each of the p-type deep layers 36 coincide with each other. In the case of Dn/Dp<1.00, as shown in FIG. 12, the lower end of each of the n-type deep layers 37 is positioned above the lower end of each of the p-type deep layers 36, and the drift layer 38 extends into the spacing portion 39 (that is, a region 39*a* in FIG. 12) below each of the n-type deep layers 37. As shown in FIG. 10, the on-resistance decreases with increase in the standard value Dn/Dp. The reason why the on-resistance is high when the standard value Dn/Dp is small is considered to be that, since the n-type impurity concentration of the region 39*a* in FIG. 12 (that is, the drift layer 38 in the spacing portion 39) is low, the width of the depletion layer extending from each of the p-type deep layers 36 to the region 39*a* in the on-state of the MOSFET is wide, and the electron flow path is narrow in the region 39*a*. As shown in FIG. 10, the on-resistance can be relatively reduced when the standard value Dn/Dp is 0.67 or more, and the on-resistance can be more effectively reduced when the standard value Dn/Dp is 1.0 or more. In addition, when the standard value Dn/Dp is large, the breakdown voltage of the MOSFET decreases. It is considered that this is because when the thickness T1 of the portion where each of the n-type deep layers 37 protrudes downward from the lower surface of each of the p-type deep layers 36 is increased, the electric field is likely to be concentrated in the drift layer 38. When the standard value Dn/Dp is 1.07 or less, a high breakdown voltage is obtained, and when the standard value Dn/Dp is 1.03 or less, the breakdown voltage is more stable.

In addition, as described above, in the MOSFET 10 of the present embodiment, each of the n-type deep layers 37 and each of the p-type deep layers 36 have a vertically long shape. When each of the n-type deep layers 37 and each of the p-type deep layers 36 are configured as described above, an electrostatic capacitance (that is, a feedback capacitance) between the gate electrode 18 and the drain electrode 24 decreases. Accordingly, a switching speed of the MOSFET 10 can be improved.

In the MOSFET 10 of the embodiment shown in FIGS. 1 to 5, the depth of each of the n-type deep layers 37 is deeper than the depth of each of the p-type deep layers 36. However, as shown in FIG. 11, the depth of each of the n-type deep layers 37 may be equal to the depth of each of the p-type deep layers 36. As shown in FIG. 12, the depth of each of the p-type deep layers 36 may be deeper than the depth of each of the n-type deep layers 37.

Figure 13:
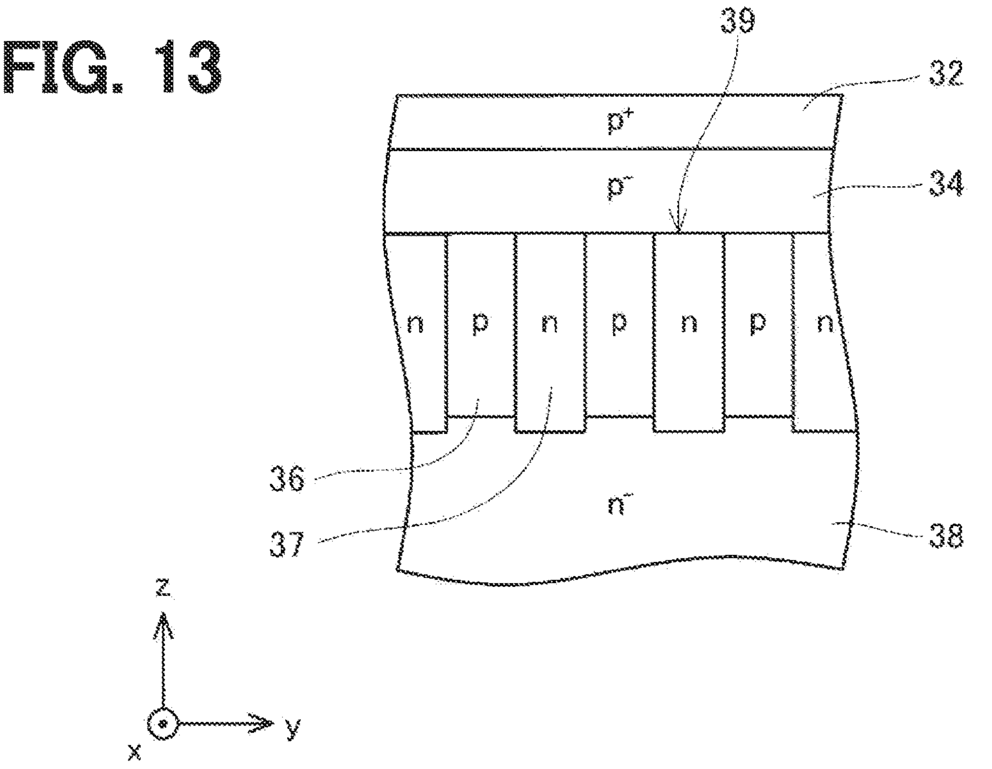
FIG. 13 is an enlarged sectional view of p-type deep layers and n-type deep layers of a MOSFET according to a third modification.

In addition, in the MOSFET 10 of the embodiment illustrated in FIGS. 1 to 5, each of the n-type deep layers 37 has the connection region 37*a* extending directly below the adjacent p-type deep layer 36. However, as shown in FIG. 13, each of the n-type deep layers 37 may have no connection region 37*a*.

Furthermore, in the above-described embodiment, each of the p-type deep layers 36 is orthogonal to each of the trenches 14. However, each of the p-type deep layers 36 may obliquely intersect each of the trenches 14.

Although the embodiments have been described in detail above, these are merely examples and do not limit the scope of claims. The techniques described in the claims include various modifications of the specific examples illustrated above. The technical elements described in the present specification or the drawings exhibit technical usefulness alone or in various combinations, and are not limited to the combinations described in the claims at the time of filing. In addition, the techniques illustrated in the present specification or drawings achieve a plurality of objectives at the same time, and achieving one of the objectives itself has technical usefulness.

What is claimed is:

1. A field effect transistor comprising:

a semiconductor substrate having a trench on an upper surface;

a gate insulating film covering an inner surface of the trench;

a gate electrode disposed inside the trench and being insulated from the semiconductor substrate by the gate insulating film, wherein the semiconductor substrate includes:

a source layer of n-type being in contact with the gate insulating film on a side surface of the trench;

a p-type contact layer disposed at the upper surface of the semiconductor substrate and between adjacent ones of the source layer;

a body layer of p-type located below the source layer and being in contact with the gate insulating film on the side surface of the trench;

a plurality of p-type deep layers;

a plurality of n-type deep layers; and a drift layer, each of the plurality of p-type deep layers protrudes downward from the body layer, extends from the body layer to a position below a bottom surface of the trench, extends along a first direction that intersects the trench when the semiconductor substrate is viewed from above, is disposed to have a spacing portion therebetween in a second direction that is orthogonal to the first direction when the semiconductor substrate is viewed from above, and is in contact with the gate insulating film on the side surface of the trench and the bottom surface of the trench located below the body layer, each of the plurality of n-type deep layers is disposed in the spacing portion and is in contact with the gate insulating film on the side surface of the trench located below the body layer, the drift layer is n-type having an n-type impurity concentration lower than an n-type impurity concentration of each of the plurality of n-type deep layers, and is in contact with a lower surface of each of the plurality of n-type deep layers, each of the plurality of p-type deep layers has a shape in which a dimension in a thickness direction of the semiconductor substrate is larger than a dimension in the second direction, each of the plurality of n-type deep layers has a shape in which a dimension in the thickness direction of the semiconductor substrate is larger than a dimension in the second direction, the plurality of n-type deep layers extend from a lower surface of the body layer to a position below a lower surface of each of the plurality of p-type deep layers, and a p-type impurity concentration of each of the plurality of p-type deep layers is higher than the p-type impurity concentration of the body layer and lower than the p-type impurity concentration of the p-type contact layer, for each of the plurality of p-type deep layers, a ratio of (i) the dimension in the thickness direction of the semiconductor substrate to (ii) the dimension in the second direction is from 1 to 4.

2. The field effect transistor according to claim 1, wherein the plurality of n-type deep layers are connected to each other via a region located below the lower surface of each of the plurality of p-type deep layers.

3. The field effect transistor according to claim 1, wherein the dimension of the plurality of n-type deep layers in the thickness direction of the semiconductor substrate is 1.07 times or less the dimension of the plurality of p-type deep layers in the thickness direction of the semiconductor substrate.

4. The field effect transistor according to claim 3, wherein the dimension of the plurality of n-type deep layers in the thickness direction of the semiconductor substrate is 1.03 times or less than the dimension of the plurality of p-type deep layers in the thickness direction of the semiconductor substrate.

5. The field effect transistor according to claim 2, wherein a distance in the thickness direction between (i) the lower surface of each of the plurality of p-type deep layers and (ii) the lower surface of the plurality of n-type deep layers is about 0.1 μm.

6. The field effect transistor according to claim 1, wherein the dimension in the second direction of each of the plurality of n-type deep layers is substantially equal to the dimension in the second direction of each of the plurality of p-type deep layers.

7. A field effect transistor comprising:

a semiconductor substrate having a trench on an upper surface;

a gate insulating film covering an inner surface of the trench;

a gate electrode disposed inside the trench and being insulated from the semiconductor substrate by the gate insulating film, wherein the semiconductor substrate includes:

a source layer of n-type being in contact with the gate insulating film on a side surface of the trench;

a body layer of p-type located below the source layer and being in contact with the gate insulating film on the side surface of the trench;

a plurality of p-type deep layers;

a plurality of n-type deep layers; and a drift layer, each of the plurality of p-type deep layers protrudes downward from the body layer, extends from the body layer to a position below a bottom surface of the trench, extends along a first direction that intersects the trench when the semiconductor substrate is viewed from above, is disposed to have a spacing portion therebetween in a second direction that is orthogonal to the first direction when the semiconductor substrate is viewed from above, and is in contact with the gate insulating film on the side surface of the trench and the bottom surface of the trench located below the body layer, each of the plurality of n-type deep layers is disposed in the spacing portion and is in contact with the gate insulating film on the side surface of the trench located below the body layer, the drift layer is n-type having an n-type impurity concentration lower than an n-type impurity concentration of each of the plurality of n-type deep layers, and is in contact with a lower surface of each of the plurality of n-type deep layers, each of the plurality of p-type deep layers has a shape in which a dimension in a thickness direction of the semiconductor substrate is larger than a dimension in the second direction, each of the plurality of n-type deep layers has a shape in which a dimension in the thickness direction of the semiconductor substrate is larger than a dimension in the second direction, the plurality of n-type deep layers extend from a lower surface of the body layer to a position below a lower surface of each of the plurality of p-type deep layers, and the dimension of the plurality of n-type deep layers in the thickness direction of the semiconductor substrate is 1.07 times or less the dimension of the plurality of p-type deep layers in the thickness direction of the semiconductor substrate.

8. The field effect transistor according to claim 7, wherein the plurality of n-type deep layers are connected to each other via a region located below the lower surface of each of the plurality of p-type deep layers.

9. The field effect transistor according to claim 7, wherein the dimension of the plurality of n-type deep layers in the thickness direction of the semiconductor substrate is 1.03 times or less than the dimension of the plurality of p-type deep layers in the thickness direction of the semiconductor substrate.

10. The field effect transistor according to claim 8, wherein a distance in the thickness direction between (i) the lower surface of each of the plurality of p-type deep layers and (ii) the lower surface of the plurality of n-type deep layers is about 0.1 μm.

11. The field effect transistor according to claim 7, wherein the dimension in the second direction of each of the plurality of n-type deep layers is substantially equal to the dimension in the second direction of each of the plurality of p-type deep layers.

12. The field effect transistor according to claim 7, wherein for each of the plurality of p-type deep layers, a ratio of (i) the dimension in the thickness direction of the semiconductor substrate to (ii) the dimension in the second direction is from 1 to 4.

13. The field effect transistor according to claim 7, wherein for each of the plurality of n-type deep layers, a ratio of (i) the dimension in the thickness direction of the semiconductor substrate to (ii) the dimension in the second direction is from 1 to 4.

14. A field effect transistor comprising:

a semiconductor substrate having a trench on an upper surface;

a gate insulating film covering an inner surface of the trench;

a gate electrode disposed inside the trench and being insulated from the semiconductor substrate by the gate insulating film, wherein the semiconductor substrate includes:

a source layer of n-type being in contact with the gate insulating film on a side surface of the trench;

a p-type contact layer disposed at the upper surface of the semiconductor substrate and between adjacent ones of the source layer;

a body layer of p-type located below the source layer and being in contact with the gate insulating film on the side surface of the trench;

a plurality of p-type deep layers;

a plurality of n-type deep layers; and a drift layer, each of the plurality of p-type deep layers protrudes downward from the body layer, extends from the body layer to a position below a bottom surface of the trench, extends along a first direction that intersects the trench when the semiconductor substrate is viewed from above, is disposed to have a spacing portion therebetween in a second direction that is orthogonal to the first direction when the semiconductor substrate is viewed from above, and is in contact with the gate insulating film on the side surface of the trench and the bottom surface of the trench located below the body layer, each of the plurality of n-type deep layers is disposed in the spacing portion and is in contact with the gate insulating film on the side surface of the trench located below the body layer, the drift layer is n-type having an n-type impurity concentration lower than an n-type impurity concentration of each of the plurality of n-type deep layers, and is in contact with a lower surface of each of the plurality of n-type deep layers, each of the plurality of p-type deep layers has a shape in which a dimension in a thickness direction of the semiconductor substrate is larger than a dimension in the second direction, each of the plurality of n-type deep layers has a shape in which a dimension in the thickness direction of the semiconductor substrate is larger than a dimension in the second direction, the plurality of n-type deep layers extend from a lower surface of the body layer to a position below a lower surface of each of the plurality of p-type deep layers, and a p-type impurity concentration of each of the plurality of p-type deep layers is higher than the p-type impurity concentration of the body layer and lower than the p-type impurity concentration of the p-type contact layer, for each of the plurality of n-type deep layers, a ratio of (i) the dimension in the thickness direction of the semiconductor substrate to (ii) the dimension in the second direction is from 1 to 4.

15. The field effect transistor according to claim 14, wherein the plurality of n-type deep layers are connected to each other via a region located below the lower surface of each of the plurality of p-type deep layers.

16. The field effect transistor according to claim 14, wherein the dimension of the plurality of n-type deep layers in the thickness direction of the semiconductor substrate is 1.07 times or less the dimension of the plurality of p-type deep layers in the thickness direction of the semiconductor substrate.

17. The field effect transistor according to claim 16, wherein the dimension of the plurality of n-type deep layers in the thickness direction of the semiconductor substrate is 1.03 times or less than the dimension of the plurality of p-type deep layers in the thickness direction of the semiconductor substrate.

18. The field effect transistor according to claim 15, wherein a distance in the thickness direction between (i) the lower surface of each of the plurality of p-type deep layers and (ii) the lower surface of the plurality of n-type deep layers is about 0.1 μm.

19. The field effect transistor according to claim 14, wherein the dimension in the second direction of each of the plurality of n-type deep layers is substantially equal to the dimension in the second direction of each of the plurality of p-type deep layers.

* * * * *